United States Patent [19]

Copeland

[11] 4,450,565
[45] May 22, 1984

[54] SPECTRALLY STABILIZED LASER
[75] Inventor: John A. Copeland, Fair Haven, N.J.
[73] Assignee: Bell Telephone Laboratories, Incorporated, Murray Hill, N.J.
[21] Appl. No.: 410,260
[22] Filed: Aug. 23, 1982
[51] Int. Cl.$^3$ ............................................. H01S 3/19
[52] U.S. Cl. ...................................... 372/32; 372/38; 372/44
[58] Field of Search ................. 372/19, 20, 29, 32, 372/38, 44

[56] References Cited

U.S. PATENT DOCUMENTS 3,898,583  8/1975  Shuey ................................. 372/38

FOREIGN PATENT DOCUMENTS 54-134993  10/1979  Japan ................................ 372/34
55-95384   7/1980   Japan ................................ 372/34
55-107284  8/1980   Japan ................................ 372/29

OTHER PUBLICATIONS

Electronics Letters, 21st vol. 15, No. 13, Jun. 1979, "Dual-Channel 1.5 Mb/s Lightwave Receiver Employing an InGaAsP Wavelength-Demultiplexing Detector"—T. P. Lee et al.
IEEE Journal of Quantum Electronics, May 1982, "Analysis of Mode Partition Noise in Laser Transmission System"—K. Ogawa.

Primary Examiner—James W. Davie
Attorney, Agent, or Firm—Sylvan Sherman

[57] ABSTRACT

Single mode lasers are advantageously stabilized in order to prevent a side mode from growing to a level where partition noise effects degrade high speed performance. To obtain such spectral stability, the powers in the two adjacent side modes are measured, and the operating temperature of the laser varied in response to changes in their relative powers. Optimally, the gain curve peak is made to coincide with the preferred cavity mode.

6 Claims, 4 Drawing Figures

SPECTRALLY STABILIZED LASER

TECHNICAL FIELD

This invention relates to semiconductor lasers and, in particular, to arrangements for stabilizing the spectral output from such lasers.

BACKGROUND OF THE INVENTION

Because the resonant cavity of a laser is much larger than the wavelength of the optical signals supported therein, it is inherently capable of resonating at a plurality of wavelengths whose nominal center-to-center spacings are inversely proportional to the length of the cavity. How many of these longitudinal cavity modes are supported depends upon the gain curve of the active laser material. In particular, oscillations occur for only those modes whose gain exceeds a threshold level fixed by the overall cavity losses. If more than one mode can be supported, there is a tendency for the laser to switch back and forth among these modes, giving rise to what is known as mode partition noise. As pointed out by K. Ogawa in a paper entitled "Analysis of Mode Partition Noise in Laser Transmission System," published in the May 1982 issue of the *IEEE Journal of Quantum Electronics*, mode partitioning among the longitudinal modes of a laser diode, combined and the chromatic dispersion of an optical fiber medium, is a limiting factor for single-mode optical fiber systems employing direct modulation of laser diodes. It is, accordingly, important to establish and maintain stable, single-mode operation of the laser.

SUMMARY OF THE INVENTION

In accordance with the present invention, the output of a semiconductor laser is stabilized by controlling its operating temperature. Means are provided for comparing the output powers in the two side modes adjacent to the desired mode, and forming an error signal. The error signal is then used to generate a control signal which varies the operating temperature of the laser so as to maintain the peak optical gain at the desired wavelength.

DETAILED DESCRIPTION

Figure 1:
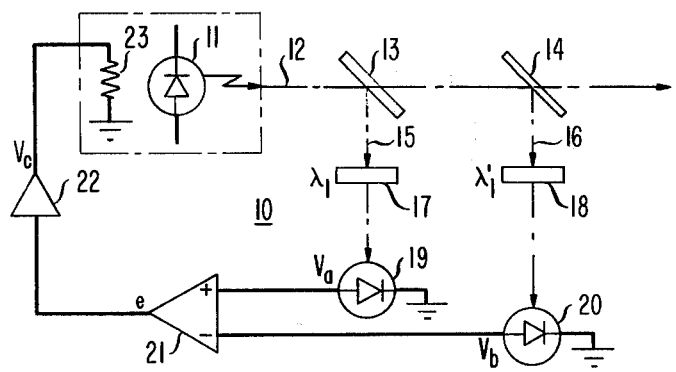
FIG. 1 shows a first embodiment of a laser stabilization circuit in accordance with the invention.

Referring the drawings, FIG. 1 shows the first embodiment of an arrangement for stabilizing the output spectrum of a semiconductor laser 11. In accordance with the invention, a small portion of the output radiation 12 is coupled out of the wavepath by means of a pair of longitudinally spaced beam splitters 13 and 14. Each of the coupled portions 15 and 16 of the output beam is passed through a wavelength filter 17 and 18, tuned respectively, to the two adjacent side modes, and onto a photodetector 19 and 20, wherein electrical signals $V_a$ and $V_b$ are generated. The latter are proportional to the power in the respective incident beam portions.

Signals $V_a$ and $V_b$ are coupled to the input ports of a comparator 21, such as a differential amplifier, which produces an error signal, e, proportional to the difference $(V_a - V_b)$ between the input signals. The error signal is, in turn, coupled to a power amplifier 22 whose output signal $V_c$ is applied to temperature control means 23 which controls the operating temperature of the laser 11.

Figure 2:
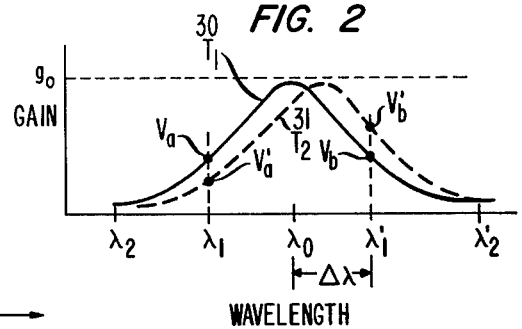
FIG. 2, included for purposes of explanation, shows the gain curve and the cavity modes for an illustrative laser.

As explained hereinabove, the longitudinal modes, or wavelengths, at which a laser operates is a combined function of the cavity dimension and the gain characteristic of the laser material. FIG. 2, included for purposes of explanation, shows the cavity resonant wavelengths $\lambda_2$, $\lambda_1$, $\lambda_0$, $\lambda_1'$, and $\lambda_2'$, where the nominal center-to-center spacings $\Delta\lambda$ between modes is proportional to the reciprocal of the cavity length. Also shown are gain curves 30 and 31.

Advantageously, the gain curve peak is located at the wavelength of interest $\lambda_0$. In FIG. 2, curve 30, corresponding to an operating temperature $T_1$, is drawn with its peak at $\lambda_0$. Thus, for the particular laser characterized by curve 30, the dominant mode is $\lambda_0$. Because the gain curve also extends over the pairs of side modes $\lambda_1$, $\lambda_1'$ and $\lambda_2$, $\lambda_2'$, oscillation may also occur at these wavelengths, producing for each mode, an average power that is inversely proportional to the difference between the cavity losses, $g_0$, and the optical gain. Because of the large difference between $g_0$ and the optical gain for the outermost side modes, there would be insufficient net gain at these wavelengths to produce appreciable output power. However, sufficient net gain may be available for appreciable output power to be generated at the adjacent cavity modes $\lambda_1$ and $\lambda_1'$. Thus, the output from laser 11 would include appreciable energy at wavelengths $\lambda_0$, $\lambda_1$ and $\lambda_1'$.

If the gain at $\lambda_1$ and $\lambda_1'$, is relatively small compared to the gain at the $\lambda_0$, the presence of these side modes may not be a problem. When energized, the laser will tend to operate stably at the dominant mode, and, for all practical purposes, the laser is regarded as a single mode laser. If, however, the gain curve shifts relative to the cavity modes due, for example, to a change in operating temperature from $T_1$ and $T_2$, this stable situation can be disturbed. In this case, as illustrated by curve 31 in FIG. 2, the gain peak has shifted away from the cavity mode at $\lambda_0$. As a result of this shift, the difference between the gain at the desired mode, $\lambda_0$, and the adjacent side mode $\lambda_1'$, has decreased. When this occurs, single mode operation may no longer obtain. If the shift is large enough, there may be a tendency for the laser to operate in either of these two modes and, indeed, to hop between them, giving rise to what is referred to as partition noise.

In addition, the second side mode power saturates at a higher level, and the power of the desired primary mode required to reach the "single-mode" condition is proportionately larger. Inasmuch as any increase in power of the primary mode increases the junction temperature, a positive feedback situation is created which, if unattended, can inhibit stable single mode operation. To counter this tendency, the powers in the two adjacent side modes $\lambda_1$ and $\lambda_1'$ are detected in photodetectors 19 and 20, and compared in comparator 21. If the gain curve 30 is symmetric about the gain peak, the side mode signals $V_a$ and $V_b$ are equal and a zero error signal is generated. The resulting control voltage $V_c$ is adjusted to provide an operating temperature which maintains the gain curve peak at the desired cavity mode, $\lambda_0$. When, however, the gain curve drifts, as indicated by curve 31, the difference in the side mode signals, $V_a'-V_b'$, is no longer zero, and an error signal, e, is produced which causes a change in the control voltage coupled to the temperature control mechanism 23.

For the example illustrated in FIG. 2, $V_b'>V_a'$ so that the sign of the voltage difference is negative. If the gain curve drifts in the opposite direction, $V_a'>V_b'$, and the sign of the voltage difference is positive. Thus, the sense of the required correction is indicated by the sign of the voltage difference. In either case, the temperature correction is such as to maintain the gain curve peak at the desired cavity mode.

Figure 3:
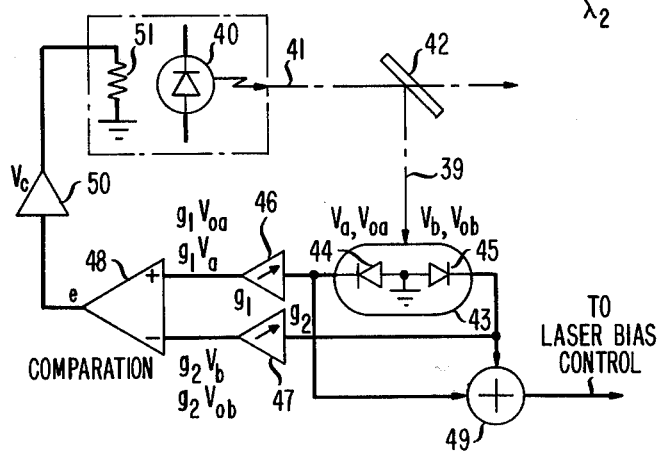
FIG. 3 shows an alternative embodiment of the invention.
Figure 4:
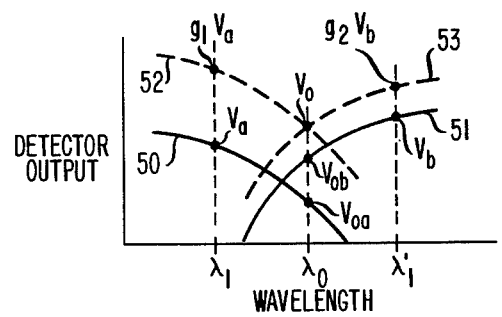
FIG. 4, included for purposes of explanation, shows typical output-wavelength characteristics of a dual-wavelength photodetector.

FIG. 3 shows an alternative embodiment of the invention employing fewer optical components which tend to be relatively expensive and difficult to align. In this embodiment, a portion 39 of the output beam 41 from a laser 40 is extracted by means of a single partially reflective mirror 42. The extracted portion is directed onto a dual wavelength photodetector 43 of the type described in a paper by T. P. Lee et al entitled "Dual-Channel 1.5 Mb/S Lightwave Receiver Employing an InGaAsP Wavelength—Demultiplexing Detector," published in the June 1979 issue of *Electronics Letters*, pp. 388–389. In the instant case, one of the dual diodes 44, having an output-wavelength characteristic given by curve 50 in FIG. 4, generates an output $V_a$ at $\lambda_1$, and an output $V_{oa}$ at $\lambda_0$. The other of the dual diodes 45, having an output-wavelength characteristic given by curve 51, generates an output $V_b$ at $\lambda_1'$, and an output $V_{ob}$ at $\lambda_0$. Because $V_{oa}$ and $V_{ob}$ are not necessarily equal, variable amplifiers 46 and 47 are advantageously included in the detector output circuits. The effect of their inclusion is to shift the detector characteristics 50, 51 by gain factors $g_1$ and $g_2$, to that given by curves 52 and 53. In particular, the gains $g_1$ and $g_2$ are adjusted such that the amplitude, $V_o$, of the signals at wavelength $\lambda_0$ applied to the comparators 48 are equal. This is $$V_o = g_1 V_{oa} = g_2 V_{ob}. \tag{1}$$

For this condition, the error signal, e, is only a function of the difference ($g_1 V_a - g_2 V_b$) in the amplitudes of the side mode signals. Any tendency for the laser gain curve to drift is corrected, as explained hereinabove, by detecting changes in the relative magnitudes of the two adjacent side modes. These changes vary the magnitude and sense of the error signal coupled to amplifier 50 and the resulting control signal $V_c$ coupled to the temperature control mechanism 51.

In addition to controlling the operating temperature of the laser, the total output power can also be stabilized by adjusting the d.c. bias applied to the laser. This is done by coupling the detector output signals $V_a$, $V_{oa}$, $V_b$ and $V_{ob}$ to an adder 49 whose output is a measure of the total output from the laser. Any variation of this output is thus sensed and can be compensated by changing the laser operating bias.

It will be noted that in the embodiment of FIG. 3 there are no wavelength selective optical components. Thus, if the laser is changed, the only adjustments that need be made in the circuit is to the relative gain of amplifiers 46 and 47 so as to satisfy equation (1).

What is claimed is:
1. In combination:
 a semiconductor laser having a preferred operating mode;
 means for measuring the output powers in a pair of side modes of said laser located adjacent to said preferred mode;
 means for comparing said output powers and forming an error signal;
 and means, responsive to said error signal, for controlling the operating temperature of said laser.

2. The combination according to claim 1 wherein:
 said laser has longitudinal cavity modes at wavelengths $\lambda_2$, $\lambda_1$, $\lambda_0$, $\lambda_1'$, $\lambda_2'$;
 said laser has a gain curve whose peak gain occurs at a wavelength which varies as a function of temperature;
 and wherein said operating temperature is adjusted such that said peak gain coincides with said cavity mode at $\lambda_0$.

3. The combination according to claim 2 wherein:
 said side modes are at wavelengths $\lambda_1$ and $\lambda_1'$, where $\lambda_1 < \lambda_0 < \lambda_1'$;
 said means for measuring is a pair of photodetectors whose output signals $V_a$ and $V_b$ are proportional to the power in the laser output signal at wavelengths $\lambda_1$ and $\lambda_1'$, respectively;
 and wherein the error signal is proportional to $V_a - V_b$.

4. The combination according to claim 2 wherein said means for measuring comprises:
 means, including a first beam splitter and a first wavelength filter, for deriving a first optical signal tuned to $\lambda_1$;
 and a first photodetector, responsive to said first optical signal, for producing an output signal $V_a$;
 means, including a second beam splitter and a second wavelength filter, for deriving a second optical signal tuned to $\lambda_1'$;
 and a second photodetector, responsive to said second optical signal, for producing an output signal $V_b$;
 and wherein said means for comparing comprises a differential amplifier whose output error signal is proportional to $V_a - V_b$.

5. The combination according to claim 2 wherein said means for measuring comprises:
 a beam splitter for extracting a portion of the output signal from said laser and for directing said portion of signal onto a dual wavelength photodetector having dual diodes;
 the output from one of said dual diodes including a signal component $V_a$ at wavelength $\lambda_1$, and a signal component $V_{oa}$ at wavelength $\lambda_0$;
 the output from the other of said dual diodes including a signal component $V_b$ at wavelength $\lambda_1'$, and a signal component $V_{ob}$ at wavelength $\lambda_0$;
 a first amplifier having a gain $g_1$ for coupling said one diode to said comparing means;
 a second amplifier having a gain $g_2$ for coupling said other diode to said comparing means;
 where said gains $g_1$ and $g_2$ are such that $$g_1 V_{oa} = g_2 V_{ob}.$$

6. The combination according to claim 1 including:
 means for measuring the output power from said laser;
 and means, responsive to said measurement, to vary the bias applied to said laser.

* * * * *